US010431268B2

(12) United States Patent
Choi et al.

(10) Patent No.: US 10,431,268 B2
(45) Date of Patent: Oct. 1, 2019

(54) SEMICONDUCTOR DEVICE AND MEMORY CONTROLLER RECEIVING DIFFERENTIAL SIGNAL

(71) Applicant: SAMSUNG ELECTRONICS CO., LTD., Suwon-si, Gyeonggi-do (KR)

(72) Inventors: Jin-Ho Choi, Seoul (KR); Seok-Kyun Ko, Minneapolis, MN (US); Sang-Hune Park, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 103 days.

(21) Appl. No.: 15/679,335

(22) Filed: Aug. 17, 2017

(65) Prior Publication Data

US 2018/0075884 A1 Mar. 15, 2018

(30) Foreign Application Priority Data

Sep. 13, 2016 (KR) .................. 10-2016-0118063
Dec. 30, 2016 (KR) .................. 10-2016-0184356

(51) Int. Cl.
*G11C 7/10* (2006.01)
*G06F 3/06* (2006.01)
*G11C 29/02* (2006.01)

(52) U.S. Cl.
CPC .......... *G11C 7/1066* (2013.01); *G06F 3/0604* (2013.01); *G06F 3/0619* (2013.01); (Continued)

(58) Field of Classification Search
CPC .... G06F 3/0604; G06F 3/0611; G06F 3/0619; G06F 3/0659; G06F 3/0673;
(Continued)

(56) References Cited

U.S. PATENT DOCUMENTS 6,753,701 B2   6/2004   Chang
6,819,602 B2  11/2004   Seo et al.
(Continued)

FOREIGN PATENT DOCUMENTS

JP     2015-125564    7/2015
KR     1020030039179  5/2003

OTHER PUBLICATIONS

DesignWare Cores DDR4 multiPHY Databook for Samsung 14LPE18, Apr. 10, 2014.

*Primary Examiner* — Gary J Portka
(74) *Attorney, Agent, or Firm* — F. Chau & Associates, LLC

(57) ABSTRACT

A semiconductor device receiving a differential data strobe signal and a method of operating the same are provided. The semiconductor device includes a differential signal phase detector receiving a differential signal including a first signal and a second signal, detecting a phase of the differential signal, and generating a mode control signal; and a receiver receiving the differential signal and a reference voltage and performing a processing operation using the differential signal in a differential mode or using the first signal and the reference voltage in a single mode according to the mode control signal. The semiconductor device may be a memory controller. Data transfer may be disabled in the single mode to prevent false data recognition due to noise.

20 Claims, 17 Drawing Sheets

(52) U.S. Cl.
CPC .......... *G06F 3/0659* (2013.01); *G06F 3/0679* (2013.01); *G11C 29/022* (2013.01); *G11C 29/028* (2013.01)

(58) Field of Classification Search
CPC ... G06F 3/0679; G11C 7/1066; G11C 29/022; G11C 29/028; G11C 2013/0042
USPC ............ 327/65; 365/193, 207, 208; 711/103
See application file for complete search history.

(56) References Cited

U.S. PATENT DOCUMENTS

| | | | |
|---|---|---|---|
| 7,031,221 B2 | 4/2006 | Mooney et al. | |
| 7,889,579 B2 | 2/2011 | Faue | |
| 8,085,067 B1* | 12/2011 | Stiff | H03F 3/45179 327/51 |
| 8,208,321 B2 | 6/2012 | Huang et al. | |
| 8,630,131 B1 | 1/2014 | Shiao et al. | |
| 8,638,622 B2 | 1/2014 | Wang et al. | |
| 2010/0309737 A1* | 12/2010 | Cheng | G11C 7/1051 365/193 |
| 2011/0085387 A1* | 4/2011 | Lee | G06Q 30/0251 365/189.02 |
| 2013/0010546 A1* | 1/2013 | Wang | G11C 7/02 365/189.07 |
| 2014/0307514 A1 | 10/2014 | Prakash et al. | |
| 2014/0359322 A1 | 12/2014 | Cheong | |

\* cited by examiner

SEMICONDUCTOR DEVICE AND MEMORY CONTROLLER RECEIVING DIFFERENTIAL SIGNAL

CROSS-REFERENCE TO RELATED APPLICATIONS

This application claims the benefit of Korean Patent Application Nos. 10-2016-0118063, filed on Sep. 13, 2016, and 10-2016-0184356, filed on Dec. 30, 2016 in the Korean Intellectual Property Office, the disclosures of which are incorporated by reference herein in their entirety.

TECHNICAL FIELD

This disclosure relates generally to a semiconductor device, and more particularly, to a semiconductor device and a memory controller receiving a differential signal and a method of operating the memory controller.

DISCUSSION OF RELATED ART

A semiconductor device may receive and process a differential signal used for internal operation of the semiconductor device. A differential data strobe signal may be used as a type of differential signal for data reception in high-speed memory operation to secure the quality of the memory operation. A clock signal robust against noise may be derived from this strobe signal. A pair of periodically varying signals in a differential data strobe signal typically has a phase difference therebetween of 180 degrees, so that rising edges of one of the signals coincides with falling edges of the other. Intersection points between the two signals at the rising and falling edges are typically detected to derive the clock signal. Data may be output from the memory synchronized with the strobe signal.

However, a 180-degree phase difference in a differential data strobe signal may not be maintained due to various causes. For instance, a system may be designed to transmit data in short bursts interspersed with idle periods, and a receiver termination may be disconnected during the idle periods to conserve power. When transitioning from the idle period to a data transfer period, the termination condition should be restored in advance of the data transfer period, but false data may be recognized during such a transition. For example, when pseudo open drain (POD) or on-die-termination (ODT) using "VSSQ-TERM" is used in a semiconductor device to control memory operations, a pair of signals in a differential data strobe signal may have the same phase, which leads to an increase in uncertainty of a clock signal generated from the differential data strobe signal to latch data. To solve the problem of false data recognition, data quality services (DQS) cleaning using gating of a clock signal, so that sampling of a data signal is selectively deactivated, in conjunction with a "gate training process" has been suggested. However, the degree of accuracy should be guaranteed per clock cycle of a high frequency in a high-speed memory interface. Incorporating such gate training while maintaining requisite accuracy has proven difficult. Moreover, the size of a semiconductor device undesirably increases with additional circuitry provisioned for the gate training.

SUMMARY

The inventive concept provides a semiconductor device and a memory controller for preventing performance deterioration caused by gate training and a method of operating the memory controller.

According to an aspect of the inventive concept, a semiconductor device may include a differential signal phase detector receiving a differential signal including a first signal and a second signal, detecting a phase of the differential signal, and generating a mode control signal. A receiver may receive the differential signal. Based on the mode control signal, the receiver may perform a processing operation using the differential signal in a differential mode or using the first signal and a reference voltage in a single mode.

According to another aspect of the inventive concept, a memory controller which receives a differential data strobe signal associated with transferring data from a memory device. The memory controller may include a differential signal phase detector generating a mode control signal according to a result of detecting whether the differential data strobe signal maintains a differential state. A receiver may receive the differential data strobe signal and a reference voltage and generated based thereon a latch control signal in a single mode when the mode control signal has a first logic state, at one or more levels sufficient to disable transfer of data during the single mode, and generate the latch control signal at time varying levels in a differential mode when the mode control signal has a second logic state, sufficient to enable the transfer of data during the differential mode.

According to a further aspect of the inventive concept, there is provided a method of operating a memory controller. The method includes receiving a differential data strobe signal used to receive data; detecting a phase of the differential data strobe signal; and changing an operating mode of a main receiver, which generates a latch control signal for latching the data using the differential data strobe signal, to a single mode or a differential mode according to a result of detecting the phase.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Hereinafter, embodiments of the inventive concept will be described in detail with reference to the accompanying drawings.

A semiconductor device may perform various functions and may generate a clock signal using an externally input differential signal for internal operations, and the various functions may be performed based on the clock signal. A semiconductor device may be a memory device which includes a memory cell array. For example, a semiconductor device may be dynamic random access memory (DRAM), such as double data rate (DDR) synchronous DRAM (SDRAM), low power DDR (LPDDR) SDRAM, graphics DDR (GDDR) SDRAM, or Rambus DRAM (RDRAM), or a non-volatile memory device such as flash memory.

Semiconductor devices may be various types of devices which are able to control or access a memory device. For example, a semiconductor device may be an application processor (AP), which may be implemented as a system on chip (SoC). The AP may include a memory control module controlling or accessing an internal or external memory device. (Herein, use of the term "module" may denote hardware.)

Semiconductor devices may be various types of devices involved in telecommunication. For example, a semiconductor device may be a modem chip which processes baseband signals, a radio frequency (RF) chip which processes high-frequency signals, or a "ModAP" in which a modem function is integrated into an AP.

Semiconductor devices as various types of devices may receive a differential signal. In the embodiments of the inventive concept described below, it is assumed for ease of explanation that a semiconductor device is a memory controller or a memory device and a differential signal is a differential data strobe signal, but embodiments of the inventive concept may also be applied to various other types of semiconductor devices which process various types of differential signals.

Figure 1:
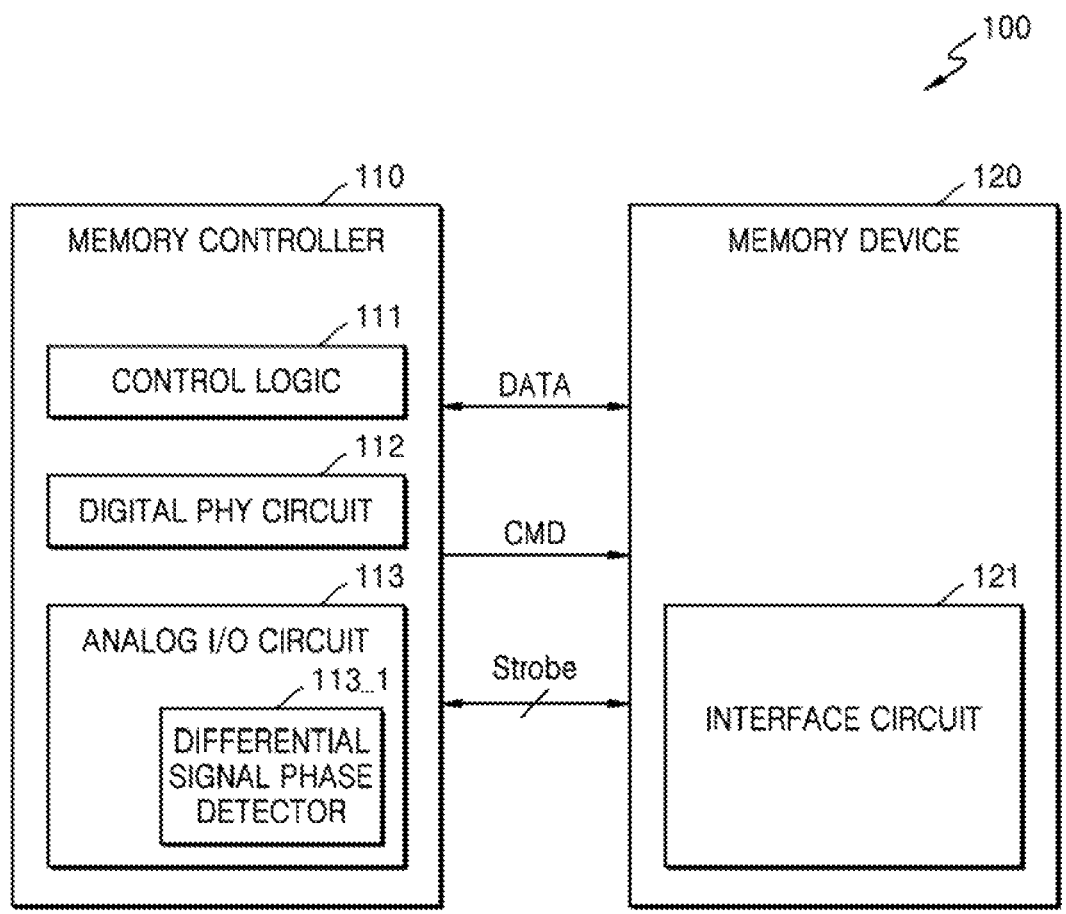
FIG. 1 is a block diagram of a memory system according to some embodiments of the inventive concept.

FIG. 1 is a block diagram of a memory system, 100, according to some embodiments of the inventive concept. Memory system 100 may include a memory controller 110 and a memory device 120. The memory controller 110 includes control logic 111 and a memory interface that may include a digital PHY circuit 112 and an analog input/output (I/O) circuit 113. Various types of signals may be provided to the memory device 120 through the memory interface to control memory operations such as read/write operations. For example, the memory controller 110 may provide a command CMD for controlling a memory operation to the memory device 120. The command CMD may include a command for a "normal" memory operation such as a data write or a data read.

As for various of clock signals involved in memory operations, the quality of a clock signal should be guaranteed in high-speed operations. Data strobe signals may be transmitted and received between the memory controller 110 and the memory device 120 as a differential signal. In the following discussion, such a differential data strobe signal will be referred to as a differential data strobe signal Strobe N/P (strobe negative/positive), or just "Strobe N/P" for brevity. Data may be transmitted and received between the memory controller 110 and the memory device 120 synchronized with the Strobe N/P signal. Memory write/read operations may be implemented in a half-duplex link to maximize data bandwidth per channel in data transmission. There may be an idle period between a read operation and a write operation.

When Strobe N/P is not controlled during an idle period, a path through which Strobe N/P is transferred may be in a floating state, and therefore, Strobe N/P loses the differential characteristic thereof. More specifically, Strobe N/P may be composed of a first signal Strobe N and a second signal Strobe P, each of which may be a pulse train or a sinusoid. These signals are said to have a differential characteristic when they are substantially 180 degrees out of phase, so that peaks of Strobe N coincide with valleys of Strobe P, and rising edges of Strobe N coincide with falling edges of Strobe P, and vice versa. (Herein, the terminology "phase of Strobe N/P" or "phase of the differential signal", etc., refers to the phase difference between the first and second signals comprising the differential signal.) During normal memory operation, a clock is derived which may be synchronized with intersections of the rising and falling edges of Strobe N and Strobe P. Data may be read/written at times synchronized with these intersections.

Strobe N/P is influenced by noise when a read mode is entered from an idle period. A clock signal used for data reception (or latch) (hereinafter, referred to as a latch control signal) is generated by processing Strobe N/P (e.g. detecting the intersections just noted). An unwanted toggle may occur in the latch control signal due to the influence of noise, particularly during the idle period. In this case, information irrelevant to real data may be wrongly recognized as read data due to the erroneously toggled latch control signal.

The memory interface of the memory controller 110 may include a differential signal phase detector 113_1 detecting a phase of Strobe N/P. The differential signal phase detector 113_1 may detect a phase of Strobe N/P and may output a detection result. The differential signal phase detector 113_1 may output the detection result having a first logic state when Strobe N/P maintains a normal differential state and may output the detection result having a second logic state when Strobe N/P does not maintain the normal differential state. For example, it may be determined that Strobe N/P maintains the differential state when Strobe N/P is within a predetermined range of 180 degrees. At this time, the detection result having the first logic state may be output. Contrarily, it may be determined that Strobe N/P does not maintain the differential state when Strobe N/P is outside the predetermined range, or, equivalently, within another predetermined range of 0 degrees. At this time, the detection result having the second logic state may be output.

An output signal of the differential signal phase detector 113_1 may be provided for a strobe signal receiver (not shown) which receives Strobe N/P and generates a latch control signal from Strobe N/P. The strobe signal receiver receives and processes Strobe N/P and outputs a latch control signal for controlling a timing of receiving data. The operation of generating the latch control signal may be controlled by the output signal of the differential signal phase detector 113_1. The strobe signal receiver may operate in various modes. For example, the strobe signal receiver may operate in a differential mode or a single mode. The strobe signal receiver may generate the latch control signal in a differential mode or a single mode according to the output signal of the differential signal phase detector 113_1. Since the output signal of the differential signal phase detector 113_1 controls the operating mode of the strobe signal receiver, the output signal may be referred to as a mode control signal.

When a conventional strobe signal receiver receives a differential data strobe signal which does not maintain a differential state or which has an in-phase relation, a state of a latch control signal generated by the strobe signal receiver is unstable. For example, the latch control signal may be unintentionally changed from logic high to logic low. When the logic state of the latch control signal is arbitrarily changed, the latch control signal may be activated at a timing at which real data is not received. In such case, data may be erroneously received.

Contrarily, according to embodiments of the inventive concept, the differential signal phase detector 113_1 may detect a phase of Strobe N/P and may control the operating mode of the strobe signal receiver based on the detected phase, so that erroneous activation of the latch control signal is prevented. For example, when Strobe N/P normally maintains the differential state or has an out-of-phase relation, the strobe signal receiver may operate in a differential mode according to the control of the differential signal phase detector 113_1 and may output a latch control signal according to a logic state of Strobe N/P.

When Strobe N/P does not maintain the differential state, the strobe signal receiver may operate in a single mode according to the control of the differential signal phase detector 113_1 and may output a latch control signal having a particular logic state according to a result of comparing only one signal in Strobe N/P with a reference signal (e.g., a reference voltage). In other words, the latch control signal may be controlled to have a particular logic state according to the single mode, so that activation of the latch control signal is prevented during a period in which data is not received.

The strobe signal receiver may perform signal processing in a differential mode based on differential signaling or in a single mode based on single-ended signaling according to the operating mode. The operating mode may be set using only external signals without using an internal signal generated separately. As such, a circuit for generating a new signal may not be needed in the memory controller 110.

Although the differential signal phase detector 113_1 is included in the memory controller 110 in the embodiments illustrated in FIG. 1, other arrangements are available. Strobe N/P may be bidirectionally transmitted between the memory controller 110 and the memory device 120. During a data write operation, Strobe N/P may be transmitted from the memory controller 110 to the memory device 120. A strobe signal receiver and a differential signal phase detector, which perform operations that are substantially the same as those described above, may be included in an interface circuit 121 of the memory device 120. The differential signal phase detector may detect a phase of Strobe N/P and may control the operating mode of the strobe signal receiver in the memory device 120. The strobe signal receiver in the memory device 120 may process Strobe N/P according to a selected operating mode to generate a clock signal (e.g., a latch control signal), which is used within the memory device 120.

Figure 2:
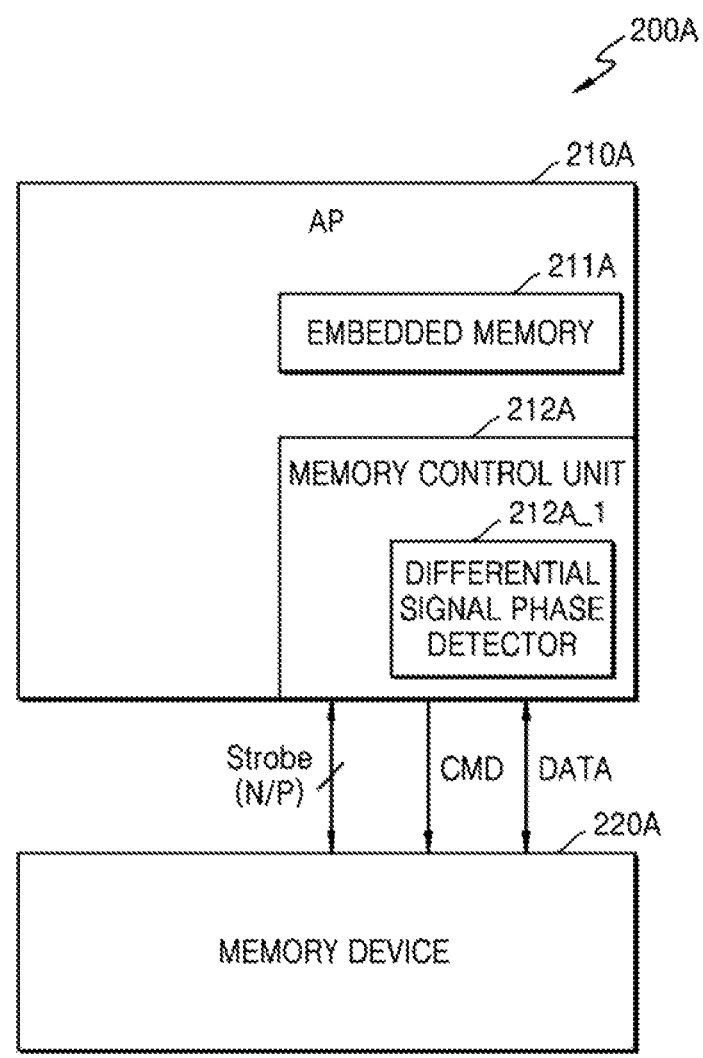
FIG. 2 is a block diagram of a data processing system including an application processor according to some embodiments of the inventive concept.

FIG. 2 is a block diagram of a data processing system, 200A, including an AP according to some embodiments of the inventive concept. Data processing system 200A may include an AP 210A and a memory device 220A. The AP 210A may be implemented as an SoC. An SoC may include a system bus (not shown) to which a protocol having a predetermined bus standard is applied and various types of intellectual properties (IPs) connected to the system bus. An advanced microcontroller bus architecture (AMBA) protocol of Advanced RISC Machine (ARM) may be used as the bus standard. Bus types of the AMBA protocol may include advanced high-performance bus (AHB), advanced peripheral bus (APB), advanced extensible interface (AXI), AXI4, and AXI coherency extensions (ACE). Other types of protocols, such as uNetwork of SONICs Inc., CoreConnect of IBM Inc., or open core protocol of OCP-IP may be used.

The AP 210A may include a memory control unit 212A. The memory control unit 212A may perform functions that are substantially the same as those of the memory controller 110 described above and thus access the memory device 220A located externally of the AP 210A. The AP 210A may also include an embedded memory 211A. The memory control unit 212A may access the memory device 220A and/or the embedded memory 211A.

The memory control unit 212A may transmit and receive data to and from the memory device 220A. The memory control unit 212A may provide the command CMD for reading data to the memory device 220A and may receive the data and Strobe N/P from the memory device 220A. As described above, Strobe N/P may have an in-phase relation in various periods including an idle period and the memory control unit 212A may include a differential signal phase detector 212A_1 to prevent characteristic deterioration which occurs when Strobe N/P has the in-phase relation. Similarly to the memory controller 110 described above, the memory control unit 212A may include an analog I/O circuit and the differential signal phase detector 212A_1 may be implemented in the analog I/O circuit.

Figure 3:
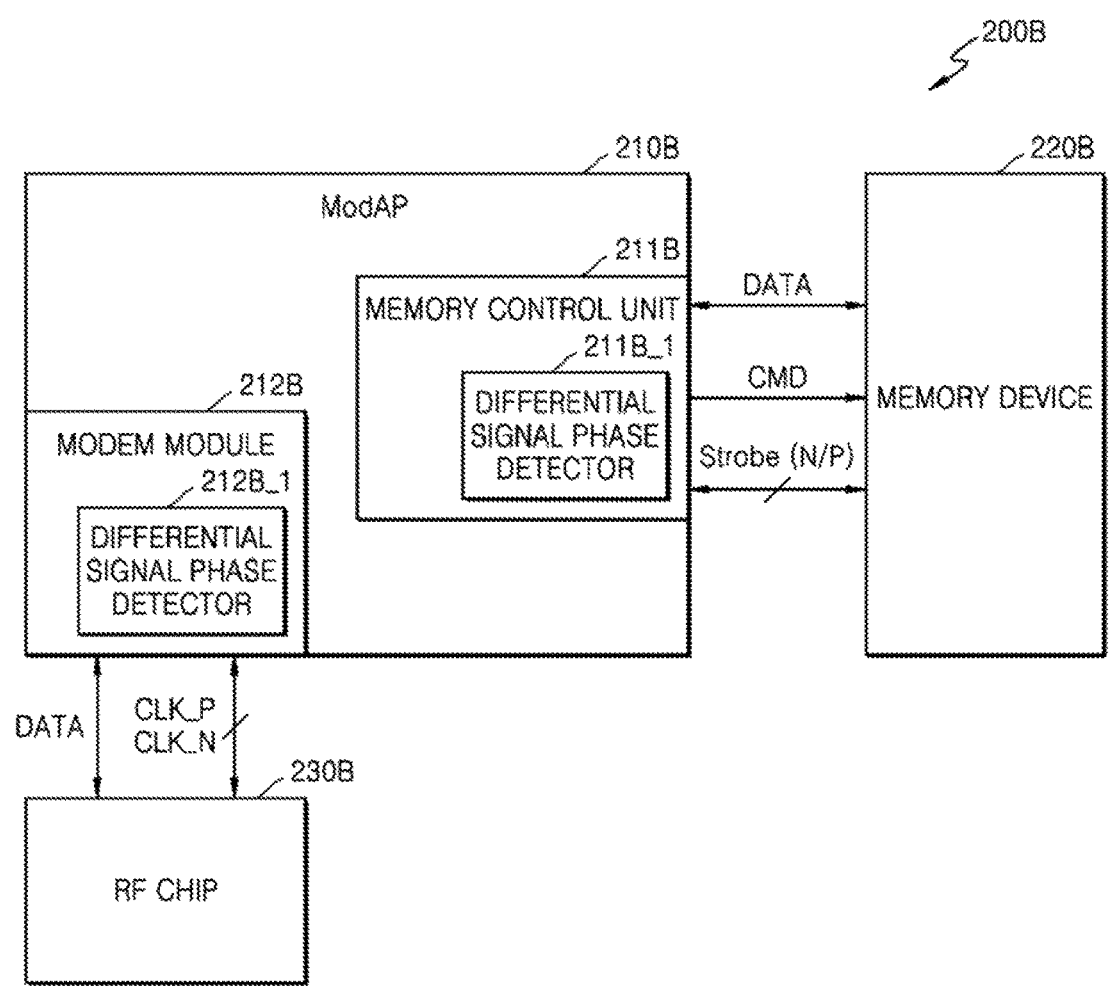
FIG. 3 is a block diagram of an example in which an embodiment of the inventive concept is applied to ModAP.

FIG. 3 is a block diagram of an example in which an embodiment of the inventive concept is applied to a ModAP. As mentioned above, since the function of a modern chip is integrated into an AP, this type of AP may be called a ModAP.

Referring to FIG. 3, a data processing system 200B including a ModAP 210B may also include a memory device 220B and an RF chip 230B which communicate with the ModAP 210B. The ModAP 210B may include a memory control unit 211B which communicates with the memory device 220B and a modem module 212B which communicates with the RF chip 230B.

As described above, the memory control unit 211B may transmit and receive various kinds of signals to and from the memory device 220B. For example, the memory control unit 211B may provide the command CMD to the memory device 220B and may receive data and Strobe N/P from the memory device 220B. The memory control unit 211B may include a differential signal phase detector 211B_1.

The modem module 212B may transmit and receive various kinds of signals to and from the RF chip 230B. For example, the modem module 212B may receive data from the RF chip 230B and may also receive differential clock signals CLK_P and CLK_N, which are used for various internal operations, from the RF chip 230B. The modem module 212B may include a receiver (not shown) which receives the differential clock signals CLK_P and CLK_N. A clock signal for controlling a predetermined function in the modem module 212B may be generated by processing the differential clock signals CLK_P and CLK_N. The modem module 212B may also include a differential signal phase detector 212B_1. The differential signal phase detector 212B_1 may operate in a manner that is substantially the same as that described above, thereby controlling an operating mode (e.g., a differential mode or a single mode) of the receiver in the modem module 212B.

Figure 4:
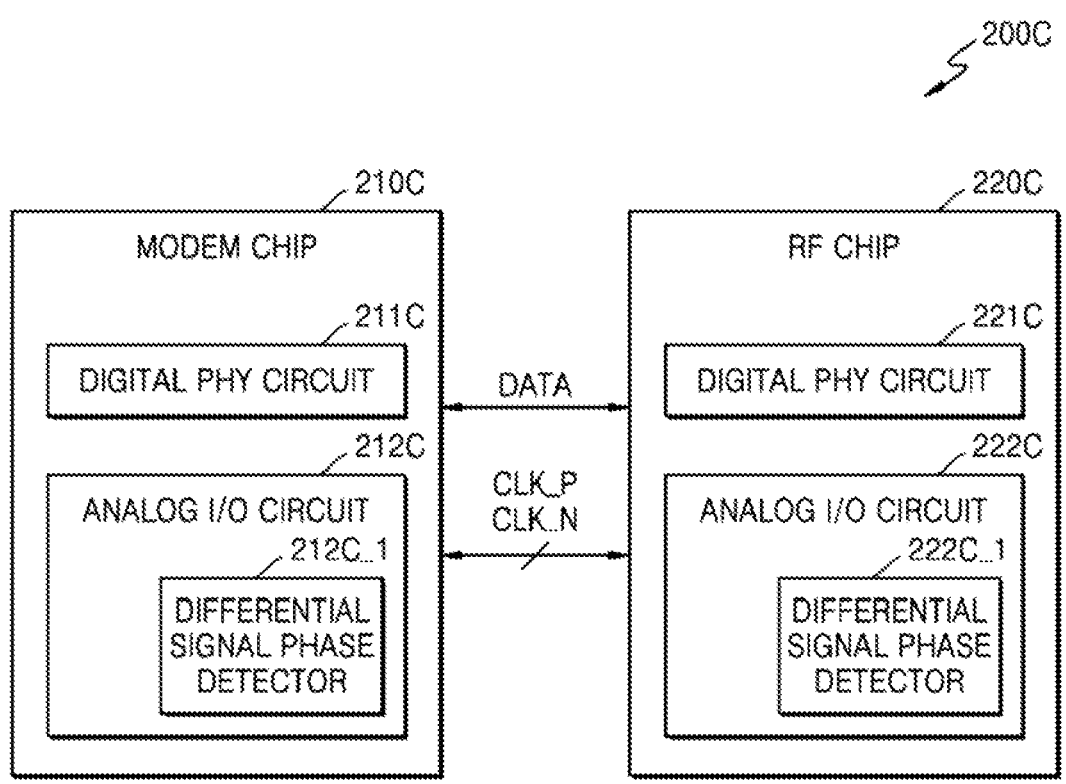
FIG. 4 is a block diagram of an example in which an embodiment of the inventive concept is applied to a modem chip and a radio frequency (RF) chip.

FIG. 4 is a block diagram of an example in which an embodiment of the inventive concept is applied to a modem chip and an RF chip. While the ModAP 210B, into which the function of a modem chip is integrated, is illustrated in FIG. 3, the current embodiments may be applied to a modern chip and/or an RF chip.

Referring to FIG. 4, a communication system 200C may include a modem chip 210C and an RF chip 220C. The modem chip 210C may include a digital PHY circuit 211C and an analog I/O circuit 212C. The RF chip 220C may include a digital PHY circuit 221C and an analog I/O circuit 222C. The modem chip 210C and the RF chip 220C may exchange data with each other. The differential clock signals CLK_P and CLKN may be transmitted and received between the modem chip 210C and the RF chip 220C. The differential clock signals CLK_P and CLKN may correspond to the data strobe signals described above.

The differential signal phase detection operation described above may be applied to the modem chip 210C and/or the RF chip 220C. The modem chip 210C may include a differential signal phase detector 212C_1 and the RF chip 220C may include a differential signal phase detector 222C_1.

Although various types of semiconductor devices to which the inventive concept may be applied have been described, the inventive concept is not limited thereto. For example, the inventive concept may also be applied to other types of semiconductor devices which externally receive a differential signal and generate a clock signal from the differential signal.

Figure 5:
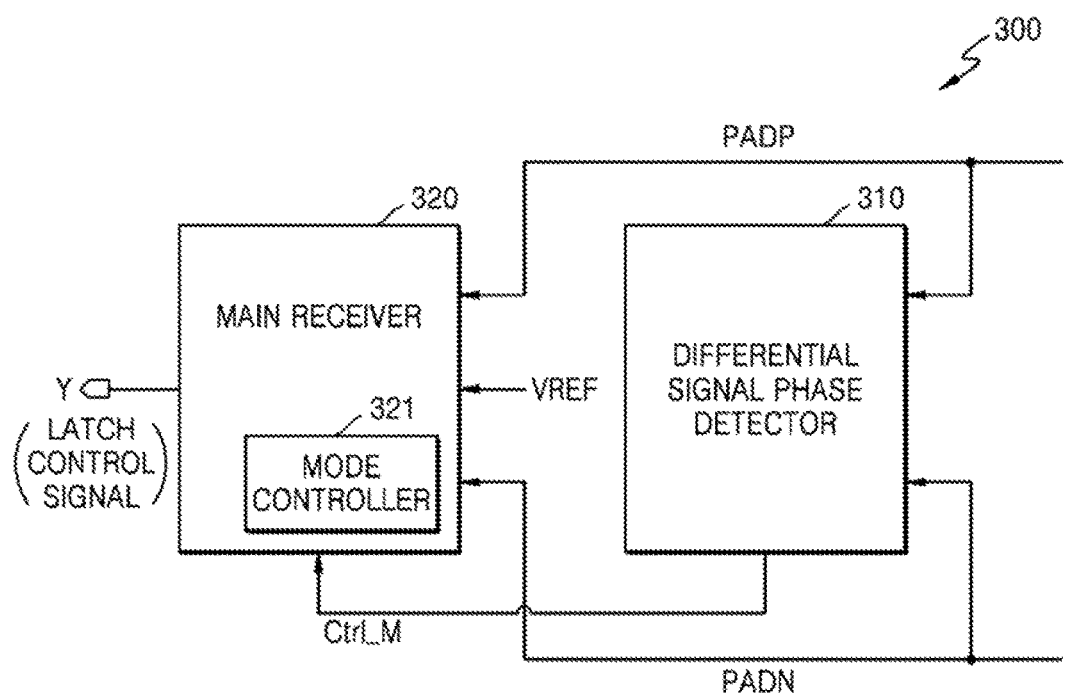
FIG. 5 is a block diagram of an interface circuit of a memory controller according to some embodiments of the inventive concept.

FIG. 5 is a block diagram of an interface circuit of a memory controller according to some embodiments of the inventive concept. It is assumed that a semiconductor device is a memory controller and an interface circuit is a memory interface which communicates with a memory device.

A memory controller 300 may include a memory interface, which may include a receiver 320, hereinafter exemplified as a main receiver 320. The main receiver 320 may receive and process a differential data strobe signal including two data strobe signals PADP and PADN (hereinafter, referred to as a differential data strobe signal PADP/PADN, or simply "signal PADP/PADN"), thereby generating a latch control signal Y used to receive (or latch) data from a memory device. Here, "PADP" and "PADN" may denote to signals present at respective circuit "pads". The memory interface may also include a differential signal phase detector 310 which performs the phase detection described above and generates a mode control signal Ctrl_M for controlling a mode based on a phase detection result.

The differential signal phase detector 310 receives signal PADP/PADN and outputs the mode control signal Ctrl_M based on a result of comparing the phases of signals PADP and PADN. The main receiver 320 includes a mode controller 321. The main receiver 320 may change a signaling method for signal PADP/PADN based on the mode control signal Ctrl_M. For example, the main receiver 320 may process signal PADP/PADN according to a differential mode based on differential signaling or a single mode based on single-ended signaling.

For example, when signal PADP/PADN having an out-of-phase relation is received, the differential signal phase detector 310 may output the mode control signal Ctrl_M having a first logic state to the main receiver 320. The main receiver 320 may operate in a differential mode in response to the mode control signal Ctrl_M having the first logic state, thereby generating the latch control signal Y of which a logic state is changed based on a level difference in signal PADP/PADN. In other words, since signal PADP/PADN has a phase difference of 180 degrees, the latch control signal Y of which the logic state is appropriately changed according to the level difference in signal PADP/PADN may be generated.

Figure 11:
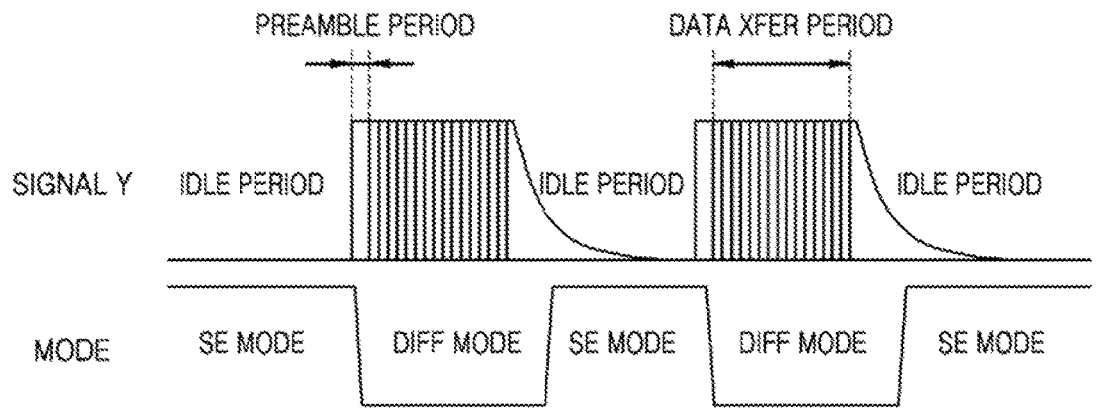
FIG. 11 is a diagram illustrating an operating mode for each period in a semiconductor device according to some embodiments of the inventive concept.

For instance, referring momentarily to FIG. 11, during the Data Transfer Period corresponding to the control signal Ctrl_M having the logic state indicative of the differential mode DIFF, it is seen that the latch signal Y is in the form of a time varying signal, e.g., a clock signal. This clock signal Y may allow the latching and thus the transfer of received data at each rising and falling edge. The clock signal Y may be derived from the signal PADP/PADN as follows: signal PADP is in the form of a pulse train or sinusoid, and signal PADN is also in the form or a pulse train or sinusoid but in opposing phase. Thus, rising edges of signal PADP occur at a times of falling edges of signal PADN and vice versa. The intersection of each of these rising edges and falling edges may be considered sampling points for a data signal from the memory (the data transfer may be thereby synchronized with signal PADP/PADN) and may trigger a change in the state of the latch signal Y, thereby generating the latch signal Y in the form of a clock signal. As a result, received data may be accurately transferred during the time period that latch signal Y is generated as a clock signal, which occurs when signal PADP/PADN is in a "differential state", i.e., an "out of phase state" in a manner similar to that explained above in connection with the Strobe N/P signal.

Contrarily, when signal PADP/PADN having an in-phase relation is received, the differential signal phase detector 310 may output the mode control signal Ctrl_M having a second logic state to the main receiver 320. The main receiver 320 may operate in a single mode in response to the mode control signal Ctrl_M having the second logic state, thereby generating the latch control signal Y of which the logic state is changed based on a level difference between one signal in signal PADP/PADN and a predetermined reference signal, e.g., a reference voltage VREF. The reference voltage VREF may have a voltage level substantially corresponding to a level half-way between signal PADP/PADN having an out-of-phase relation. Accordingly, even when signal PADP/PADN has an in-phase relation (or has one voltage level), there is a level difference between signal PADP/PADN and the reference voltage VREF.

Since the main receiver 320 operates in a single mode, the latch control signal Y may be controlled to maintain one logic state even when signal PADP/PADN has an in-phase relation. For example, the latch control signal Y may be maintained to have a logic low state in the single mode. Accordingly, the latch control signal Y may be maintained deactivated, so that a problem in that data is wrongly latched due to erroneous toggling of the latch control signal Y is decreased. For instance, referring momentarily again to FIG. 11, it is seen that during an Idle Period corresponding to an SE (Single End) mode, the latch signal Y is maintained steadily at a logic low. Since the latch signal Y does not change state during the idle period, noise appearing at a data input port should not be wrongly recognized as data. As such, any transfer of false data may be disabled. (Note that data is not intentionally provided by the memory device during the idle period.) The prevention of false data recognition in this manner is sometimes herein referred to as "DQS data cleaning".

Figure 6:
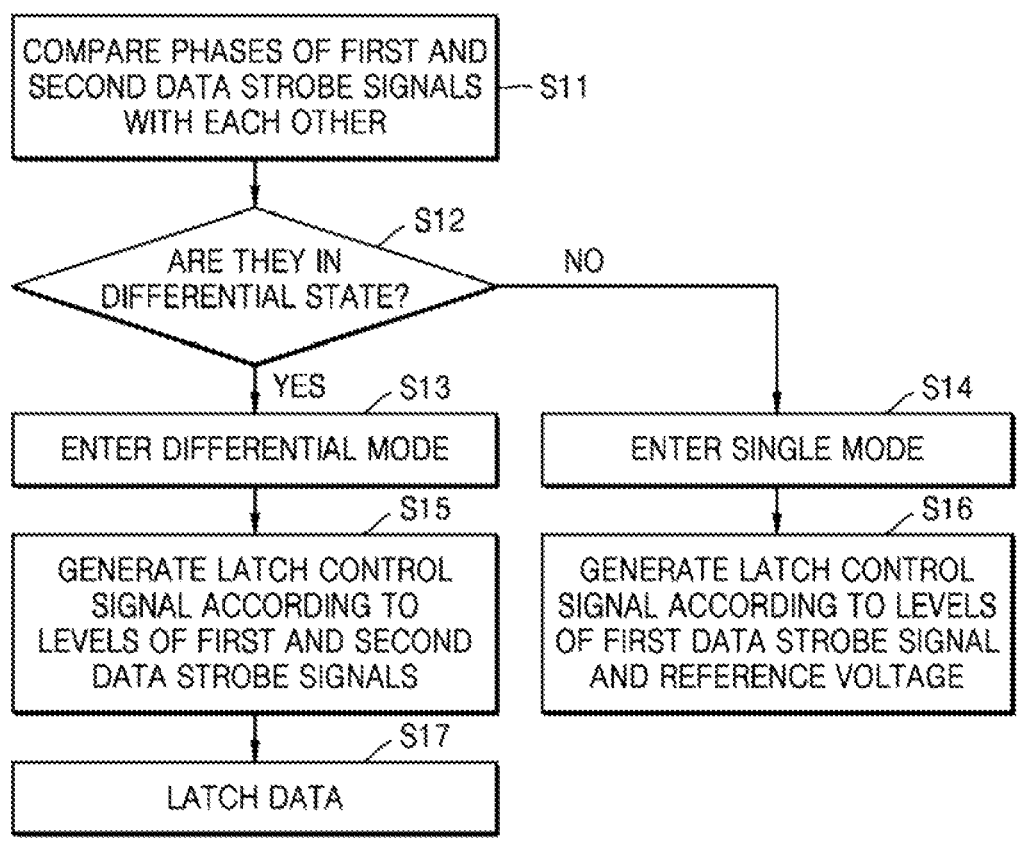
FIGS. 6 and 7 are flowcharts of a method of operating a memory controller, according to some embodiments of the inventive concept.
Figure 7:
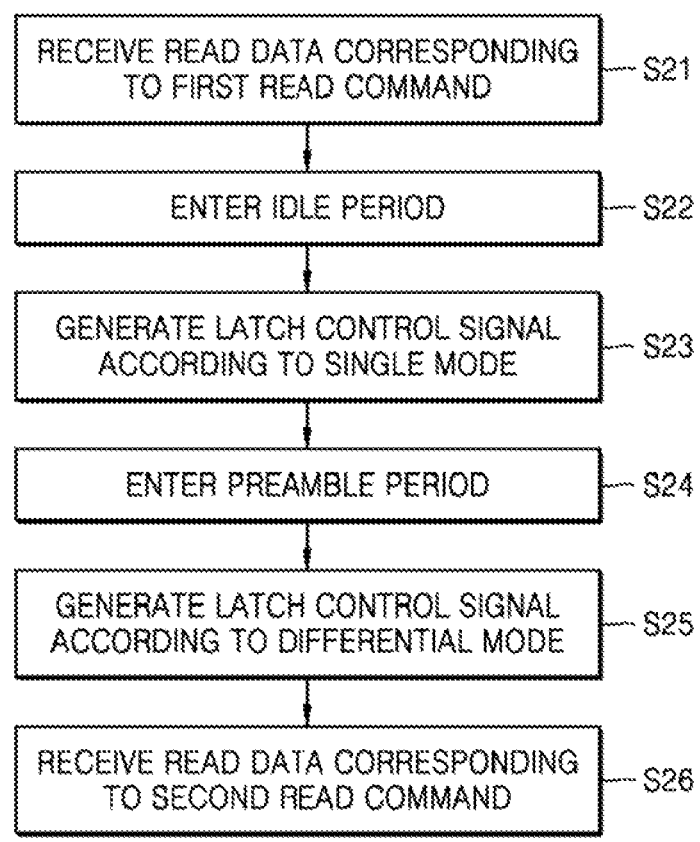

FIGS. 6 and 7 are flowcharts of a method of operating a memory controller, according to some embodiments of the inventive concept.

Referring to FIG. 6, a memory controller may include a memory interface and the memory interface may receive first and second data strobe signals as a differential data strobe signal. The memory interface may include a differential signal phase detector which generates a mode control signal according to phases of the first and second data strobe signals and a main receiver which processes the first and second data strobe signals and generates a latch control signal for latching read data.

The phases of the first and second data strobe signals are compared with each other in operation S11. The mode control signal having a first logic state or a second logic state may be generated according to a result of the comparison. For example, whether the first and second data strobe signals are in a differential state may be determined according to the comparison result in operation S12.

If the first and second data strobe signals are in the differential state, the main receiver may enter a differential mode according to the mode control signal in operation S13. Contrarily, if the first and second data strobe signals are not in the differential state (or when the first and second data strobe signals are in phase), the main receiver may enter a single mode according to the mode control signal in operation S14.

In the differential mode, the main receiver may generate the latch control signal according to levels of the first and second data strobe signals in operation S15. The first and second data strobe signals, which normally have a differential characteristic, may be provided for the main receiver. For example, the first and second data strobe signals, which are toggled and have opposite phases to each other, may be provided for the main receiver. The latch control signal may also have a waveform toggled in correspondence to the first and second data strobe signals. Read data provided for the memory controller may be latched by the latch control signal which has been generated in the differential mode in operation S17.

Meanwhile, in the single mode, the main receiver may generate the latch control signal according to levels of a reference voltage and one data strobe signal, e.g., the first data strobe signal, in operation S16. The first and second data strobe signals may have the same level during an idle period. For example, the first and second data strobe signals may both have a logic low level. In conventional systems, when a latch control signal is generated according to a level difference between the first and second data strobe signals having the same level, a state of the latch control signal is unknown and the latch control signal may be erroneously toggled.

However, according to the embodiments of the inventive concept, the level of the first data strobe signal may be compared with the level of the reference voltage in the single mode and the latch control signal may be controlled to maintain a particular logic state according to a result of the comparison. For example, when the first data strobe signal has a logic low state, the latch control signal may be maintained to have a logic low state. After the idle period ends, a preamble period may be entered. During the preamble period, the differential data strobe signal may be maintained to have a particular state, e.g., a differential state, or the differential data strobe signal may be toggled at least once regardless of receiving real data. During the preamble period, the first and second data strobe signals normally have a differential characteristic, so that the main receiver may operate in the differential mode.

Referring to FIG. 7, there may be an idle period and a preamble period between memory operations such as read operations or write operations. A memory controller may provide a first read command to a memory device and receive read data corresponding to the first read command from the memory device in operation S21.

When the read operation is completed, the memory controller may enter an idle period in operation S22 before a next read operation is performed. In the idle period, since first and second data strobe signals do not have a differential characteristic, a main receiver enters a single mode and generates a latch control signal according to the single mode in operation S23.

Before read data corresponding to a second read command is input to the memory controller, the memory controller may enter a preamble period in which the first and second data strobe signals are toggled at least once in operation S24. During the preamble period, the first and second data strobe signals may have a differential characteristic, and therefore, as described above, the main receiver may generate a latch control signal according to a differential mode in operation S25. The preamble period may correspond to 2*CLK, where CLK denotes a period of a system clock cycle of the memory controller or the memory device. The operating mode of the main receiver may be changed from the single mode to the differential mode during the preamble period. After the operating mode is changed to the differential mode, the memory controller may receive or latch the read data corresponding to the second read command in operation S26.

Although the methods of operating a memory controller have been described above, the operating methods may also be applied to a memory device in a manner that is substantially the same as that described above.

Figure 8A:
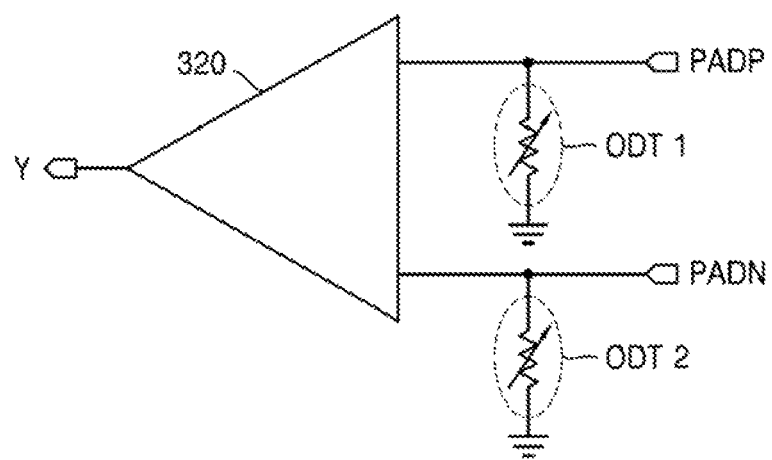
FIGS. 8A and 8B are circuit diagrams of a main receiver applied to some embodiments of the inventive concept.
Figure 8B:
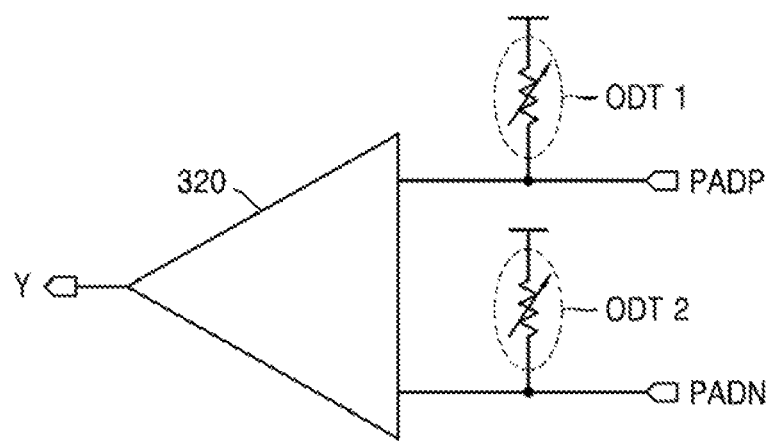

FIGS. 8A and 8B are circuit diagrams of the main receiver 320 applied to some embodiments of the inventive concept. On-die-termination (ODT) may be applied to an input terminal of the main receiver 320 to compensate for signal quality deterioration caused by impedance mismatching in a memory system operating at a high speed. For example, an ODT resistor ODT1 may be provided between an input terminal PADP of the main receiver 320 and a ground voltage, as shown in FIG. 8A, or between the input terminal PADP of the main receiver 320 and a power supply voltage, as shown in FIG. 8B. A resistor ODT2 may be similarly provided at the PADN terminal. A termination scheme shown in FIG. 8A may be referred to as pseudo open drain (POD) termination. When the POD termination is used, a signal swing is reduced to a half swing rather than a general full swing (i.e., 0 to VDDQ swing).

In such a case, when signal PADP/PADN has an in-phase relation during the idle period described above, the differential data strobe signal PADP/PADN having a logic high state or a logic low state may be input to both input terminals of the main receiver 320. At this time, the latch control signal Y output from the main receiver 320 has an unstable logic state. Conventionally, to prevent unwanted toggling from occurring in the latch control signal Y before real data is received (or during an idle period), a gate window is generated through a gate training process in a memory controller and data is latched within only the gate window, so that a possibility of erroneously latching data is decreased. The training process used to generate a gate window may be referred to as a data quality services (DQS) cleaning process.

However, according to the embodiments of the inventive concept, ODT is applied to the input terminals of the main receiver 320, so that even when PADP/PADN having an in-phase relation is input to the input terminals of the main receiver 320, an operating mode for processing PADP/PADN is controlled so that erroneous latching of data is prevented. In addition, the DQS cleaning process may be performed in an I/O analog block without needing an additional training process/time, so that consumption of resources for training is reduced. Moreover, since an increase in a chip size for the DQS cleaning process is not necessary, the performance of a memory interface is increased.

Figure 9:
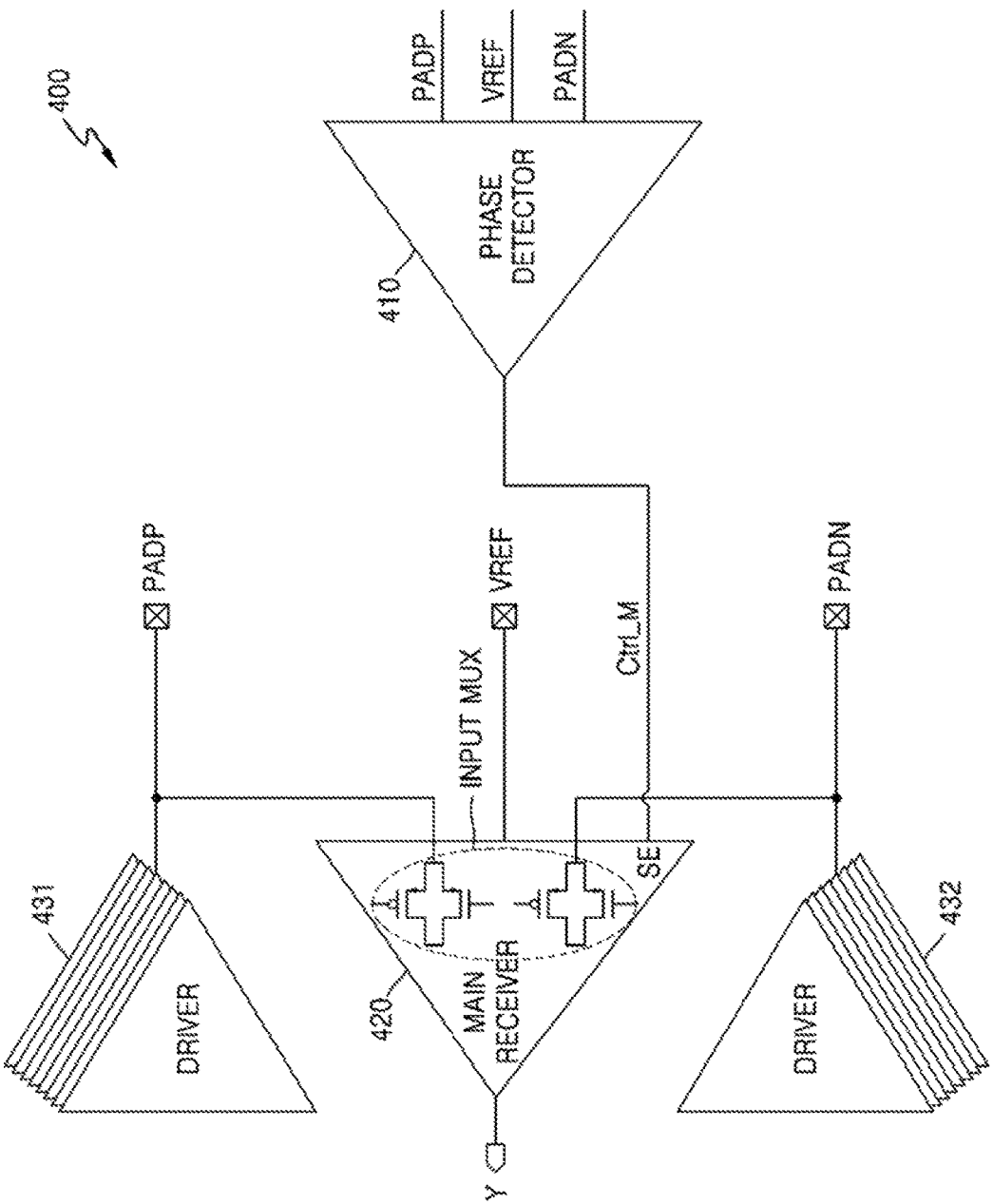
FIG. 9 is a circuit diagram of an interface circuit of a memory controller according to some embodiments of the inventive concept.

FIG. 9 is a circuit diagram of an interface circuit of a memory controller according to some embodiments of the inventive concept.

Referring to FIG. 9, a memory controller 400 includes a memory interface. The memory interface may include a main receiver 420, which receives and processes signal PADP/PADN and generates the latch control signal Y used to receive or latch data from a memory device. The memory interface may also include a differential signal phase detector 410, which performs the phase detection described above and generates the mode control signal Ctrl_M for controlling a mode based on a result of the phase detection. The memory interface may also include a plurality of driver circuits 431 and 432 which drive signal PADP/PADN provided for a memory device (not shown) when the memory controller 400 transmits data to the memory device.

The differential signal phase detector 410 may receive signal PADP/PADN and the reference voltage VREF and may output the mode control signal Ctrl_M based on signal PADP/PADN and the reference voltage VREF. Like the differential signal phase detector 410, the main receiver 420 may receive PADP/PADN and the reference voltage VREF and may generate and output the latch control signal Y based on the differential data strobe signals PADP and PADN and the reference voltage VREF. The main receiver 420 may include a separate input terminal SE receiving the mode control signal Ctrl_M. A block of various kinds of selectors, i.e., a selector block INPUT MUX in the main receiver 420 may be controlled according to the mode control signal Ctrl_M.

When the main receiver 420 operates in a differential mode, the selector block INPUT MUX in the main receiver 420 may output PADP/PADN and the main receiver 420 may output the latch control signal Y based on a voltage level difference in PADP/PADN. However, when the main receiver 420 operates in a single mode, the main receiver 420 may output the latch control signal Y based on a voltage level difference between one signal in PADP/PADN and the reference voltage VREF. For example, the main receiver 420 may output the latch control signal Y based on a voltage level difference between the reference voltage VREF and a positive signal in PADP/PADN. Only one signal in PADP/PADN may be used for voltage level comparison due to the operation of the selector block INPUT MUX in the main receiver 420.

The operation described above enables self DQS cleaning in an analog I/O block of a memory controller, so that a glitch is removed from the latch control signal Y transmitted from the analog I/O block to a digital PHY block.

Figure 10:
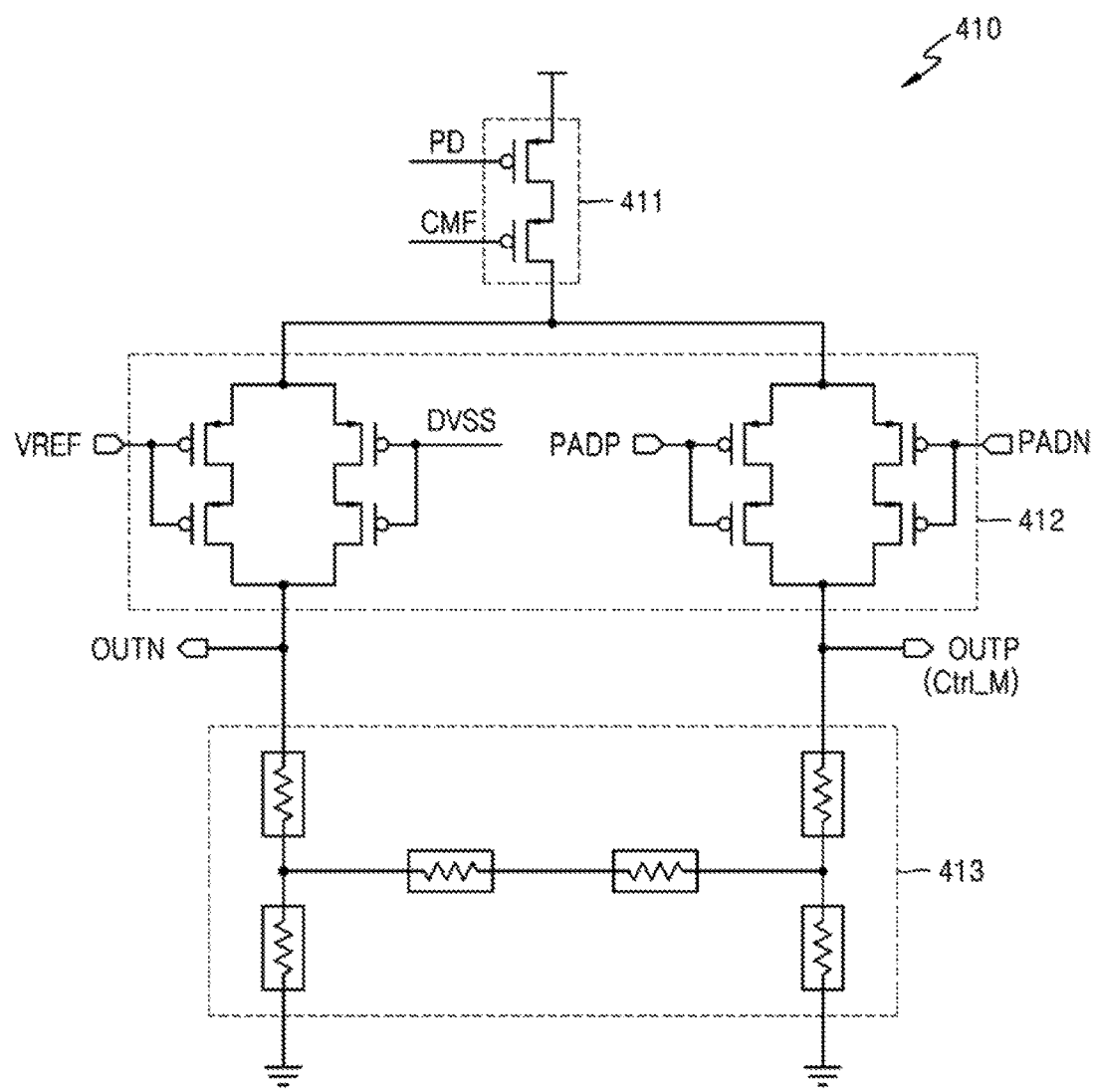
FIG. 10 is a circuit diagram of a differential signal phase detector shown in FIG. 9 according to some embodiments of the inventive concept.

FIG. 10 is a circuit diagram of a differential signal phase detector as shown in FIG. 9 according to some embodiments of the inventive concept. In the embodiments illustrated in FIG. 10, a differential signal phase detector may perform amplification according to a result of detecting a phase or level of PADP/PADN. The operation of a differential signal phase detector in a case where an input terminal of a main receiver is connected to an ODT resistor connected to a ground voltage in a memory interface to which the differential signal phase detector is applied will be described.

Referring to FIG. 10, the differential signal phase detector 410 may include a bias applying block 411, a comparator circuit 412, and at least one bias resistor 413. The bias applying block 411 may include at least one switch to control internal biasing of the differential signal phase detector 410. Various kinds of control signals PD and CMF for controlling the at least one switch may be provided for the bias applying block 411. A memory controller (or an AP) including the differential signal phase detector 410 may determine an enable timing of the differential signal phase detector 410. The control signals PD and CMF may be internally generated in the memory controller.

The comparator circuit 412 may compare phases of two signals in PADP/PADN with each other and may develop voltages at output terminals OUTN and OUTP of the differential signal phase detector 410 according to a comparison result. For example, the comparator circuit 412 may include a first comparator which drives the first output terminal OUTN according to a level difference between the reference voltage VREF and a predetermined voltage (e.g., a ground voltage DVSS) and a second comparator which drives the second output terminal OUTP according to a level difference in signal PADP/PADN. An output from each of the first and second output terminals OUTN and OUTP may be provided for the main receiver as the mode control signal Ctrl_M. For example, the mode control signal Ctrl_M may be generated through a predetermined process using a differential output from the first and second output terminals OUTN and OUTP or the output of one of the first and second output terminals OUTN and OUTP may be provided as the mode control signal Ctrl_M.

When signal PADP/PADN has an out-of-phase relation, smaller current flows in the second output terminal OUTP than in the first output terminal OUTN, and therefore, a voltage at the second output terminal OUTP may have a lower level than that at the first output terminal OUTN. Contrarily, when signal PADP/PADN has an in-phase relation and thus has one voltage level or similar voltage levels (or has a logic low level), transistors to which signal PADP/PADN is applied are more strongly turned on, and therefore, a voltage at the second output terminal OUTP may have a higher level than that at the first output terminal OUTN. Through this comparison operation, the differential signal phase detector 410 may output the mode control signal Ctrl_M which has a different logic state according to a phase of PADP/PADN.

As shown in FIG. 10, the differential signal phase detector 410 may detect a phase of signal PADP/PADN using only signals used by the main receiver without needing a separately generated input. In addition, when signal PADP/

PADN having an out-of-phase relation is received, the main receiver operates in a differential mode with better duty characteristics according to the mode control of the differential signal phase detector 410. When signal PADP/PADN having an in-phase relation due to an influence of ODT or the like during an idle period, a state of signal PADP/PADN is determined based on the reference voltage VREF and a glitch may be removed from the latch control signal Y based on the determination.

FIG. 11 is a diagram illustrating operating modes for each of various periods related to memory access in a semiconductor device according to some embodiments of the inventive concept. According to the inventive concept, when a differential signal (e.g., a differential data strobe signal) has an in-phase relation during an idle period in which data is not intended to be accessed, a main receiver operates in a single mode, i.e., an SE (Single End) mode. Thereafter, there is a period (e.g., a preamble period) of predetermined duration or pre-established via handshake or the like between a memory controller and a memory device. The preamble period may substantially correspond to, for example, two clock cycles, i.e., 2*CLK. When the preamble period starts, the differential data strobe signal may be changed to have an out-of-phase relation. For example, one signal in the differential data strobe signal may maintain a logic high state and the other signal in the differential data strobe signal may maintain a logic low state during the preamble period. The differential data strobe signal may be toggled at least once during the preamble period.

Since the differential data strobe signal has the out-of-phase relation, a differential signal phase detector may detect a phase difference in the differential data strobe signal and may output a mode control signal for changing the operating mode of the main receiver based on the detected phase difference. The operating mode of the main receiver may be changed into a differential mode, i.e., a DIFF mode, during the preamble period which substantially corresponds to two clocks as described above.

Thereafter, the differential data strobe signal toggled at predetermined intervals is provided for the memory controller together with data read from the memory device. The main receiver operates in the DIFF mode during a Data Transfer period in which the main receiver receives the read data, so that the main receiver may generate the latch control signal Y, from the differential data strobe signal and may receive the read data in synchronization with the latch control signal Y. As shown in FIG. 11, the latch control signal Y may normally be toggled in a DIFF mode and may be changed to and maintained at a logic low level in an SE mode.

It can be seen from FIG. 11 that the latch control signal Y is not toggled during a period, such as an idle period, in which actual (intended) data is not received according to the embodiments of the inventive concept. This means that DQS cleaning is implemented in real time in an analog I/O circuit which receives the differential data strobe signal.

Figure 12:
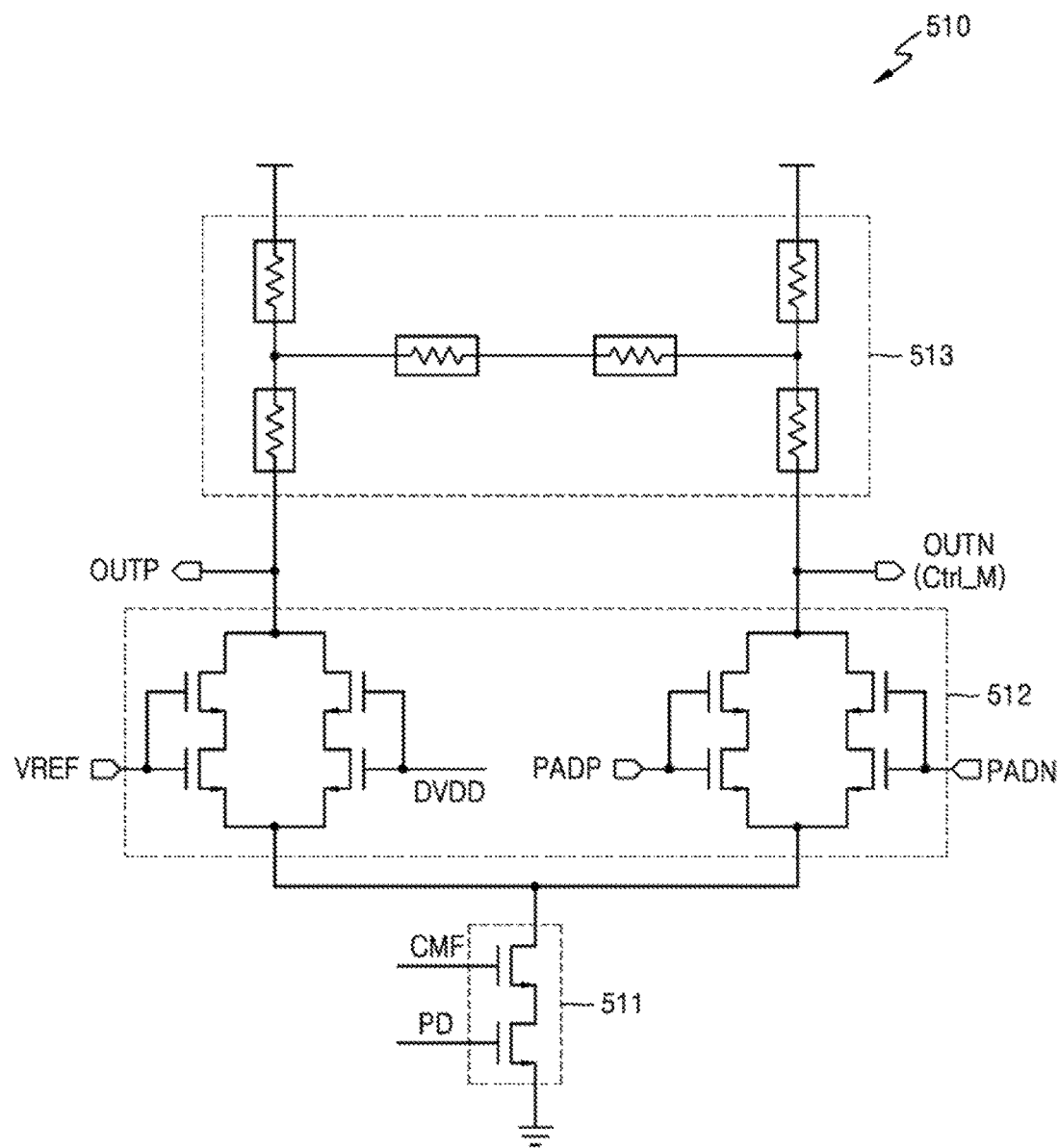
FIG. 12 is a circuit diagram of a differential signal phase detector shown in FIG. 9 according to other embodiments of the inventive concept.

FIG. 12 is a circuit diagram of a differential signal phase detector as shown in FIG. 9 according to other embodiments of the inventive concept. A differential signal phase detector which uses an ODT resistor having an end connected to a power supply voltage and the other end connected to an input terminal of a main receiver when ODT is applied to the input terminal of the main receiver is illustrated in FIG. 12. Unlike the embodiments based on PMOS transistors in FIG. 10, the embodiments shown in FIG. 12 use NMOS transistors. However, the inventive concept is not limited thereto and the circuits shown in FIGS. 10 and 12 may be variously changed.

Referring to FIG. 12, a differential signal phase detector 510 may include a bias applying block 511, a comparator circuit 512, and at least one bias resistor 513. The bias applying block 511 may include at least one switch to control internal biasing of the differential signal phase detector 510. Various kinds of the control signals PD and CMF for controlling the at least one switch may be provided for the bias applying block 511.

As described above, the comparator circuit 512 may compare phases of two signals in signal PADP/PADN with each other and may develop voltages at the output terminals OUTN and OUTP of the differential signal phase detector 510 according to a comparison result. For example, when signals PADP and PADN have an out-of-phase relation, larger current flows in the second output terminal OUTP than in the first output terminal OUTN and the voltages of the first and second output terminals OUTN and OUTP may be developed according to a current difference between the first and second output terminals OUTN and OUTP. Contrarily, when signal PADP/PADN has an in-phase relation, transistors receiving signal PADP/PADN are strongly turned on and larger current flows in the first output terminal OUTN than in the second output terminal OUTP. Through this comparison operation, the differential signal phase detector 510 may output the mode control signal Ctrl_M which has a different logic state according to a phase of signal PADP/PADN.

Figure 13:
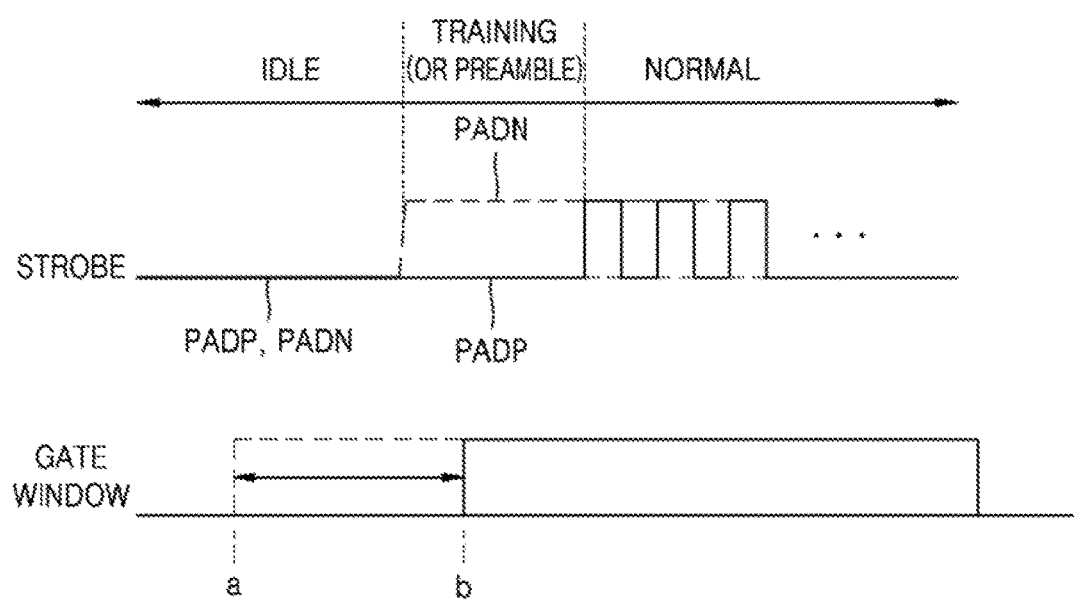
FIG. 13 is a diagram illustrating that a gate window is set in a memory controller according to some embodiments of the inventive concept.

FIG. 13 is a diagram illustrating that a gate window is set in a memory controller according to some embodiments of the inventive concept.

Referring to FIG. 13, there may be an idle period in which data access is not performed, a predetermined period (e.g., a gate training period) agreed in advance before data access is performed, and a normal period in which data access is performed. The gate training period may correspond to or include the preamble period described above.

The differential data strobe signal PADP/PADN may have an in-phase relation during the idle period and may have and maintain an out-of-phase relation during the gate training period while each signal in signal PADP/PADN maintains a constant voltage level. Alternatively, although not shown, signal PADP/PADN may be toggled at least once during the gate training period while each signal in signal PADP/PADN maintains a constant voltage level. The signal PADP/PADN may be toggled with the out-of-phase relation maintained in the normal period.

According to some embodiments of the inventive concept, reliability of data reception is increased without a separate training operation performed in a digital PHY block during a gate training period. In conventional systems, it is necessary to finely control an activation timing of a gate window through gate training to prevent erroneous reception of data due to unintentional toggling of the latch control signal Y. An activation period of the gate window may be controlled according to a logic state of a gate signal (not shown), which is generated to mask a period other than a period in which a differential data strobe signal is normally toggled.

According to embodiments of the inventive concept, a state of the latch control signal Y may be appropriately controlled as intended even during the idle period and the training period, so that a gate training operation for precise control of the gate window is unnecessary. In addition, the gate window may be secured to be wide and the activation timing of the gate window may be variously adjusted between a point "a" and a point "b".

Various other embodiments of the inventive concept will be described herein below. It should be noted, however, that the inventive concept is not limited to structures described below and various methods of changing an operating mode of a main receiver according to a phase of a differential data strobe signal may be used.

Figure 14:
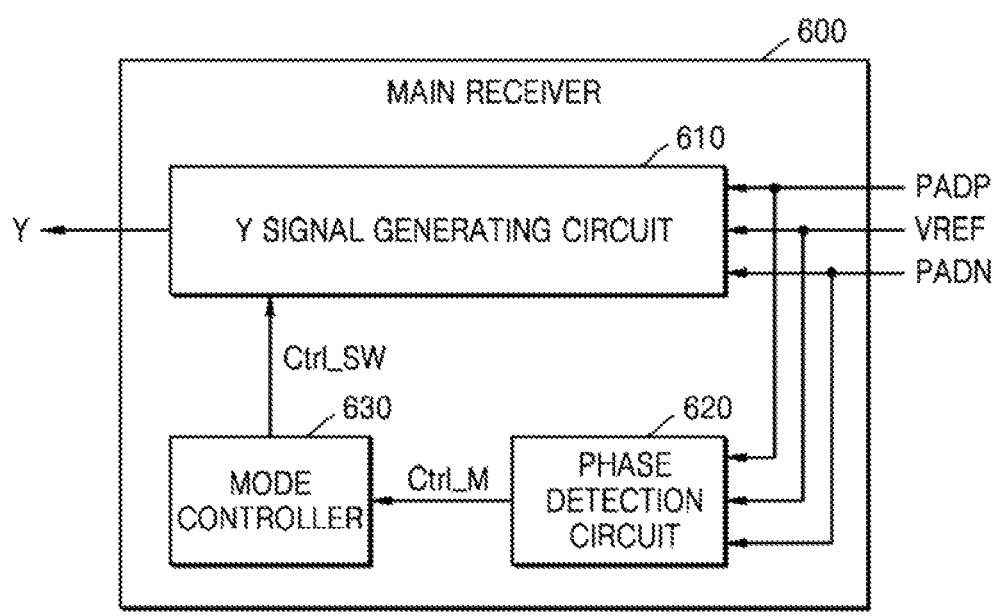
FIG. 14 is a block diagram of a main receiver according to certain embodiments of the inventive concept.

FIG. 14 is a block diagram of a main receiver according to certain embodiments of the inventive concept.

Referring to FIG. 14, a main receiver 600 may include a latch control signal generating circuit, i.e., a Y generating circuit, 610 which generates the latch control signal Y, a phase detection circuit 620, and a mode controller 630. In the embodiments illustrated in FIG. 14, the phase detection circuit 620 is not separately implemented from the main receiver 600 but is included within the main receiver 600. At this time, there is no need to form a transmission path outside the main receiver 600 to provide PADP/PADN in parallel for the phase detection circuit 620. In other words, the phase detection circuit 620 may receive PADP/PADN through input terminals of the main receiver 600.

The phase detection circuit 620 may include various circuits to detect or compare phases of the signals PADP and PADN in the differential data strobe signal PADP/PADN. The phase detection circuit 620 may detect the phases of signal PADP/PADN by further using the reference voltage VREF and may output the mode control signal Ctrl_M based on a detection result.

The mode controller 630 may generate a control signal Ctrl_SW for controlling a mode of the Y signal generating circuit 610 in response to the mode control signal Ctrl_M. The Y signal generating circuit 610 may include at least one switch (or multiplexer) and may generate the latch control signal Y using signal PADP/PADN or using one signal in signal PADP/PADN and the reference voltage VREF according to an operating mode (e.g., a differential mode or a single mode). The signals used to generate the latch control signal Y may be selected according to the control signal Ctrl_SW.

Figure 15:
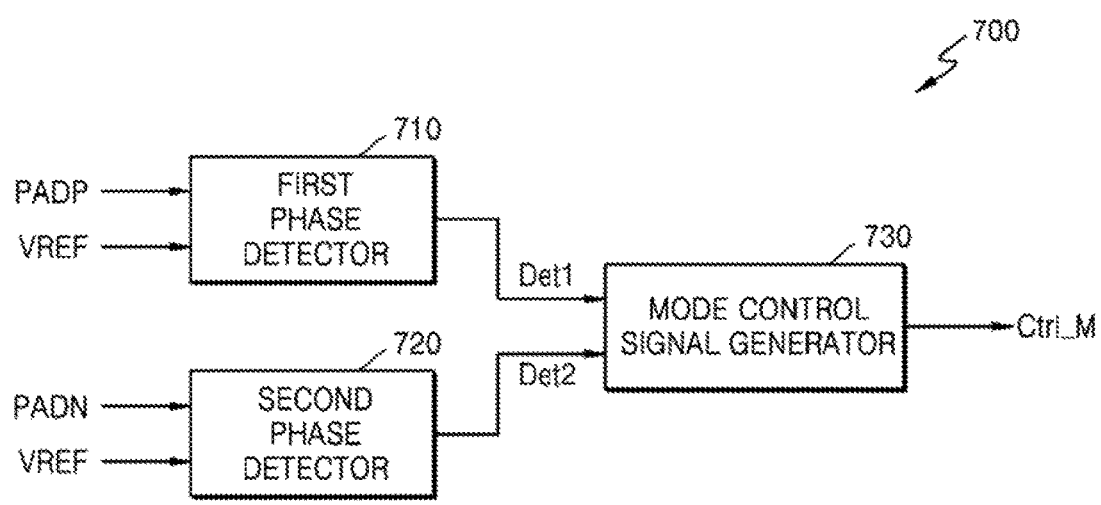
FIG. 15 is a block diagram of a differential signal phase detector according to some embodiments of the inventive concept.

FIG. 15 is a block diagram of a differential signal phase detector according to some embodiments of the inventive concept.

Referring to FIG. 15, a differential signal phase detector 700 may include a first phase detector 710, a second phase detector 720, and a mode control signal generator 730. The first phase detector 710 may receive the reference voltage VREF and the first data strobe signal PADP in PADP/PADN and may perform a comparison operation on the reference voltage VREF and the first data strobe signal PADP. The first phase detector 710 may output a first detection result Det1 obtained by detecting a phase or level of the first data strobe signal PADP based on the comparison operation. The second phase detector 720 may receive the reference voltage VREF and the second data strobe signal PADN in signal PADP/PADN and may perform a comparison operation on the reference voltage VREF and the second data strobe signal PADN. The second phase detector 720 may output a second detection result Det2 obtained by detecting a phase or level of the second data strobe signal PADN based on the comparison operation.

The mode control signal generator 730 may generate the mode control signal Ctrl_M based on the first detection result Det1 and the second detection result Det2. In detail, the mode control signal generator 730 may determine a differential state of signal PADP/PADN, depending on the first detection result Det1 and the second detection result Det2, and may generate the mode control signal Ctrl_M according to the differential state of signal PADP/PADN.

Figure 16:
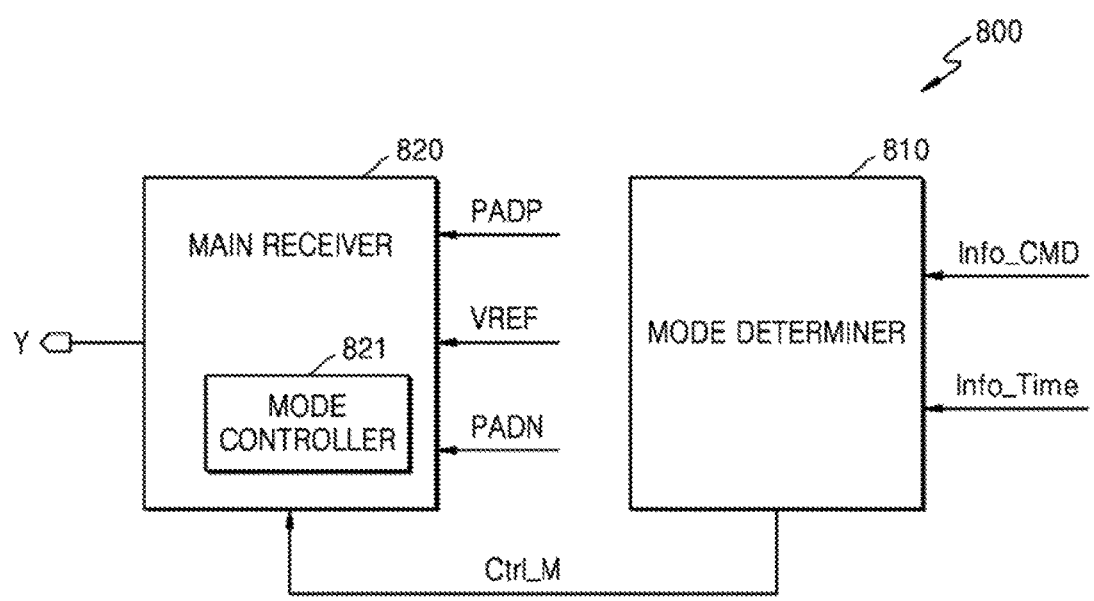
FIG. 16 is a block diagram of an interface circuit of a memory controller according to certain embodiments of the inventive concept.

FIG. 16 is a block diagram of an interface circuit of a memory controller according certain embodiments of the inventive concept.

Referring to FIG. 16, a memory controller 800 may include a memory interface, which may include a main receiver 820. The main receiver 820 may receive signal PADP/PADN and the reference voltage VREF and may generate the latch control signal Y based on the control of a mode controller 821.

The memory interface may also include a mode determiner 810. The mode determiner 810 may determine an operating mode of the memory controller 800 or a memory device (not shown) based on various kinds of information. For example, when the memory controller 800 provides a data read command for the memory device, the mode determiner 810 may determine a timing of a preamble period for receiving of data corresponding to the read command and a timing of a period for receiving read data.

For example, the mode determiner 810 may receive information Info_CMD about a command provided for the memory device and information Info_Time about time of various kinds of periods and may generate the mode control signal Ctrl_M based on the information Info_CMD and the information Info_Time. A time (e.g., the number of clock cycles) between outputting of a read command and receiving of real read data may be predefined and a time a predetermined period of time (e.g., 2*CLK) before a time when the read data is received may be a starting point of a preamble period. The mode determiner 810 may determine output or non-output of a read command, a time at which an idle period ends and a preamble period starts, and a time of reception of read data based on the information Info_CMD and the information Info_Time.

The mode determiner 810 may predict a differential characteristic of the differential data strobe signal PADP/PADN according to the determination result. For example, the mode determiner 810 may predict that the first and second output terminals OUTN and OUTP do not have the differential characteristic until the end of (or during) an idle period. Accordingly, the mode determiner 810 may generate the mode control signal Ctrl_M for controlling the main receiver 820 to operate in a single mode. Contrarily, the mode determiner 810 may predict that the first and second output terminals OUTN and OUTP have the differential characteristic when a preamble period starts and thus generate the mode control signal Ctrl_M for controlling the main receiver 820 to operate in a differential mode.

Figure 17:
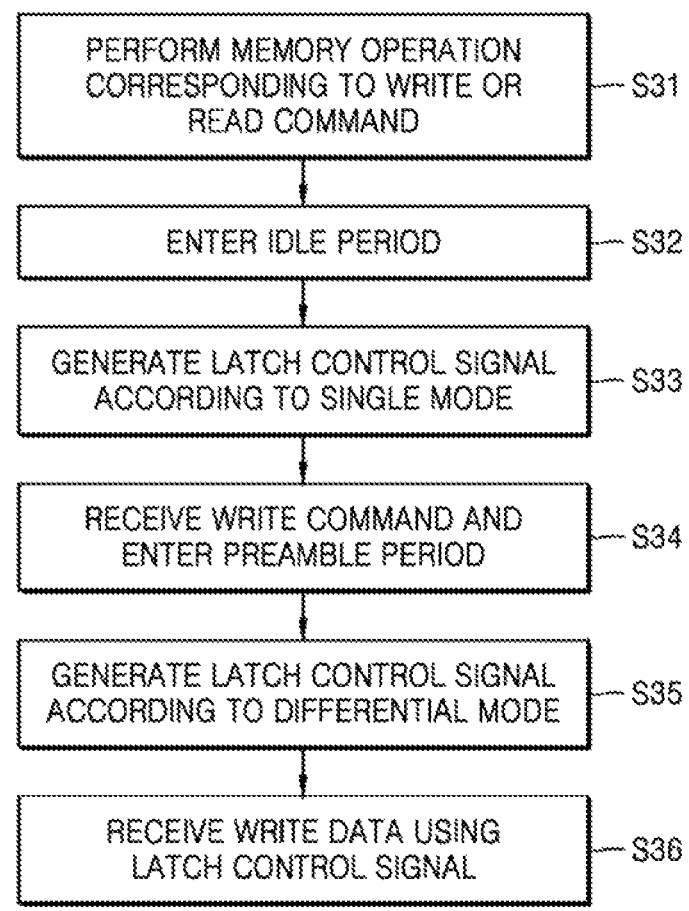
FIG. 17 is a flowchart of a method of operating a memory device, according to some embodiments of the inventive concept.

FIG. 17 is a flowchart of a method of operating a memory device according to some embodiments of the inventive concept.

Referring to FIG. 17, the memory device may include a memory interface. The memory device may perform a memory operation corresponding to a write or read command from a memory controller in operation S31. When the read command is received, the memory device may provide the data and the differential data strobe signal, which have been described above, for the memory controller. When the write command is received, the memory device may receive write data and the differential data strobe signal from the memory controller.

When the memory operation is completed, the memory device may enter an idle period before a next memory operation starts in operation S32. The memory device may include a main receiver which receives the differential data strobe signal. As described above, an ODT resistor connected to a ground voltage or a power supply voltage may be placed at an input terminal of the main receiver. Accordingly, the differential data strobe signal input to the memory device has an in-phase characteristic in at least a part of the idle period. The main receiver generates a latch control signal according to a single mode through the mode control operation described above in operation S33.

Thereafter, the memory device receives another write command from the memory controller and enters a preamble period in operation S34 before the memory device writes real data. As the memory device enters the preamble period, the differential data strobe signal has an out-of-phase characteristic. The main receiver generates a latch control signal according to a differential mode through the mode control operation described above in operation S35. The memory device receives write data using the latch control signal, which has been generated according to the differential mode, in operation S36.

According to some embodiments of the inventive concept, performance of a high-speed memory interface is enhanced and a hard/soft macro size of a digital PHY block in a memory controller may be reduced. Further, in the related art, gate training has been repeated by ranks every time voltage and frequency are changed when dynamic voltage frequency scaling (DVFS) is used for memory interfacing. As a result, a proportion of a blackout time in memory access rapidly increases. According to some embodiments of the inventive concept, however, such gate training is unnecessary, so that the proportion of a blackout time is reduced.

Herein, the term "substantially" is meant to convey that the recited characteristic, parameter, or value need not be achieved exactly, but that deviations or variations, including but in no way limited to, for example, tolerances, measurement error, measurement accuracy limitations and other factors known to persons of ordinary skill in the art, may occur in amounts that do not preclude the effect the characteristic was intended to provide.

While the inventive concept has been particularly shown and described with reference to embodiments thereof, it will be understood that various changes in form and details may be made therein without departing from the spirit and scope of the following claims and their equivalents.

What is claimed is:

1. A semiconductor device comprising:
a differential signal phase detector configured to receive a differential signal comprising a first signal and a second signal, detect a phase between the first and second signals, and generate a mode control signal according to the phase detected; and
a receiver configured to receive the differential signal and, based on the mode control signal, perform a processing operation using the differential signal in a differential mode, or, perform a processing operation using the first signal and a reference voltage in a single mode.

2. The semiconductor device of claim 1, wherein the processing operation using the differential signal comprises generating a clock signal synchronized with intersection points of the first and second signals.

3. The semiconductor device of claim 1, wherein the differential signal phase detector generates the mode control signal having a first logic state when the first and second signals are substantially in phase with each other and generates the mode control signal having a second logic state when the first and second signals are substantially out of phase with each other.

4. The semiconductor device of claim 3, wherein the receiver operates in the single mode in response to the mode control signal having the first logic state and operates in the differential mode in response to the mode control signal having, the second logic state.

5. The semiconductor device of claim 1, wherein the differential signal phase detector receives the reference voltage and detects the phase of the differential signal using the first and second signals and the reference voltage.

6. The semiconductor device of claim 1, wherein the differential signal is a differential data strobe signal used to receive data;
the first and second signals are first and second data strobe signals; and
the receiver generates a latch control signal for latching the data using the first and second data strobe signals in the differential mode and deactivates the latch control signal to prevent erroneous data latching, using the first data strobe signal and the reference voltage in the single mode.

7. The semiconductor device of claim 1, wherein the semiconductor device provides a data read command for a memory device and has an idle period and a preamble period before a data read period; and
the receiver operates in the single mode in at least a part of the idle period.

8. The semiconductor device of claim 7, wherein the receiver changes its operating mode from the single mode into the differential mode during the preamble period.

9. The semiconductor device of claim 1, wherein the differential signal phase detector comprises:
a first comparator driving at least one output terminal according to a level difference between the reference voltage and a first voltage having a predetermined level; and
a second comparator driving the at least one output terminal according to a level difference between the first signal and the second signal, and
the mode control signal has a logic state according to a result of driving the at least one output terminal.

10. The semiconductor device of claim 9, wherein the first comparator comprises at least one first MOS transistor connected to a first output terminal and receiving the reference voltage, and at least one second MOS transistor connected to the first output terminal and receiving the first voltage; and
the second comparator comprises at least one third MOS transistor connected to a second output terminal and receiving the first signal and at least one fourth MOS transistor connected to the second output terminal and receiving the second signal.

11. The semiconductor device of claim 10, wherein the first voltage has a ground voltage level and each of the first through fourth MOS transistors is a PMOS transistor.

12. The semiconductor device of claim 10, wherein the first voltage has a power supply voltage level and each of the first through fourth MOS transistors is an NMOS transistor.

13. The semiconductor device of claim 1, wherein the differential signal phase detector comprises:
a first phase detector detecting a phase of the first signal;
a second phase detector detecting a phase of the second signal; and
a mode control signal generator generating the mode control signal using detection results of the first and second phase detectors.

14. The semiconductor device of claim 1 wherein the processing operation using the first signal and the reference voltage is a data quality services (DOS) cleaning operation in which data transfer is disabled.

15. A memory controller which receives a differential data strobe signal associated with transferring data from a memory device, the differential data strobe signal comprising a first data strobe signal and a second data strobe signal, the memory controller comprising:
a differential signal phase detector configured to generate a mode control signal according to a result of detecting whether the differential data strobe signal maintains a differential state in which the first data strobe signal and the second data strobe signals are substantially 180 degrees out of phase; and
a receiver configured to receive the differential data strobe signal and a reference voltage and generate based thereon a latch control signal in a single mode when the mode control signal has a first logic state, at one or more levels sufficient to disable transfer of data during the single mode, and generate the latch control signal at time varying levels in a differential mode when the mode control signal has a second logic state, sufficient to enable the transfer of data during the differential mode.

16. The memory controller of claim 15, wherein:
the differential signal phase detector outputs the mode control signal having the first logic state when the first and second data strobe signals do not maintain the differential state and outputs the mode control signal having the second logic state when the first and second data strobe signals maintain the differential state.

17. The memory controller of claim 16, wherein the differential signal phase detector outputs the mode control signal having the first logic state when a phase difference between the first and second data strobe signals is within a predetermined range of 0 degrees and outputs the mode control signal having the second logic state when the phase difference between the first and second data strobe signals is within a predetermined range of 180 degrees.

18. The memory controller of claim 15, wherein the differential signal phase detector receives the reference voltage and detects whether the differential data strobe signal maintains the differential state using the differential data strobe signal and the reference voltage.

19. The memory controller of claim 15, wherein the receiver derives the latch control signal at one or more levels sufficient to disable transfer of data during the single mode based on only the first data strobe signal or the second data strobe signal of the differential data strobe signal and the reference voltage, and derives the latch control signal at the time varying levels in the differential mode based on first and second data strobe signals of the differential data strobe signal.

20. The memory controller of claim 19, wherein the receiver generates the latch control signal maintained at a logic low state or a logic high state in the single mode.

* * * * *